United States Patent
Suzuki et al.

(10) Patent No.: US 8,871,655 B2
(45) Date of Patent: Oct. 28, 2014

(54) METHOD OF FORMING SILICON OXYCARBONITRIDE FILM

(71) Applicant: Tokyo Electron Limited, Tokyo (JP)

(72) Inventors: Keisuke Suzuki, Nirasaki (JP); Kentaro Kadonaga, Nirasaki (JP); Byoung Hoon Lee, Hwaseong-si (KR); Eun Jo Lee, Hwaseong-si (KR); Sung Duk Son, Hwaseong-si (KR); Jae Hyuk Jang, Hwaseong-si (KR); Do Hyun Park, Hwaseong-si (KR)

(73) Assignee: Tokyo Electron Limited (JP)

( * ) Notice: Subject to any disclaimer, the term of this patent is extended or adjusted under 35 U.S.C. 154(b) by 98 days.

(21) Appl. No.: 13/726,778

(22) Filed: Dec. 26, 2012

(65) Prior Publication Data
US 2013/0164946 A1 Jun. 27, 2013

(30) Foreign Application Priority Data

Dec. 27, 2011 (JP) ................................. 2011-286342

(51) Int. Cl.
*H01L 21/31* (2006.01)
*H01L 21/02* (2006.01)
*C23C 8/34* (2006.01)
*C23C 16/24* (2006.01)
*C23C 16/56* (2006.01)
*C23C 28/04* (2006.01)
*C23C 28/00* (2006.01)

(52) U.S. Cl.
CPC .......... *H01L 21/31* (2013.01); *H01L 21/02126* (2013.01); *H01L 21/022* (2013.01); *C23C 8/34* (2013.01); *C23C 16/24* (2013.01); *C23C 16/56* (2013.01); *C23C 28/04* (2013.01); *C23C 28/42* (2013.01)
USPC ............................ 438/778; 438/763; 438/786

(58) Field of Classification Search
USPC ................... 438/761, 763, 778, 780, 781, 786
See application file for complete search history.

(56) References Cited

U.S. PATENT DOCUMENTS

2012/0184110 A1* 7/2012 Hirose et al. .................. 438/763

FOREIGN PATENT DOCUMENTS

| JP | 2010153795 | 7/2010 |
| JP | 2011029480 | 2/2011 |
| JP | 2011192875 | 9/2011 |
| JP | 2011238894 | 11/2011 |
| JP | 2012160704 | 8/2012 |

* cited by examiner

Primary Examiner — Kevin M Picardat
(74) Attorney, Agent, or Firm — Cantor Colburn LLP

(57) ABSTRACT

The method of forming a silicon oxycarbonitride film on a base includes stacking a silicon carbonitride film and a silicon oxynitride film on the base to form the silicon oxycarbonitride film.

10 Claims, 21 Drawing Sheets

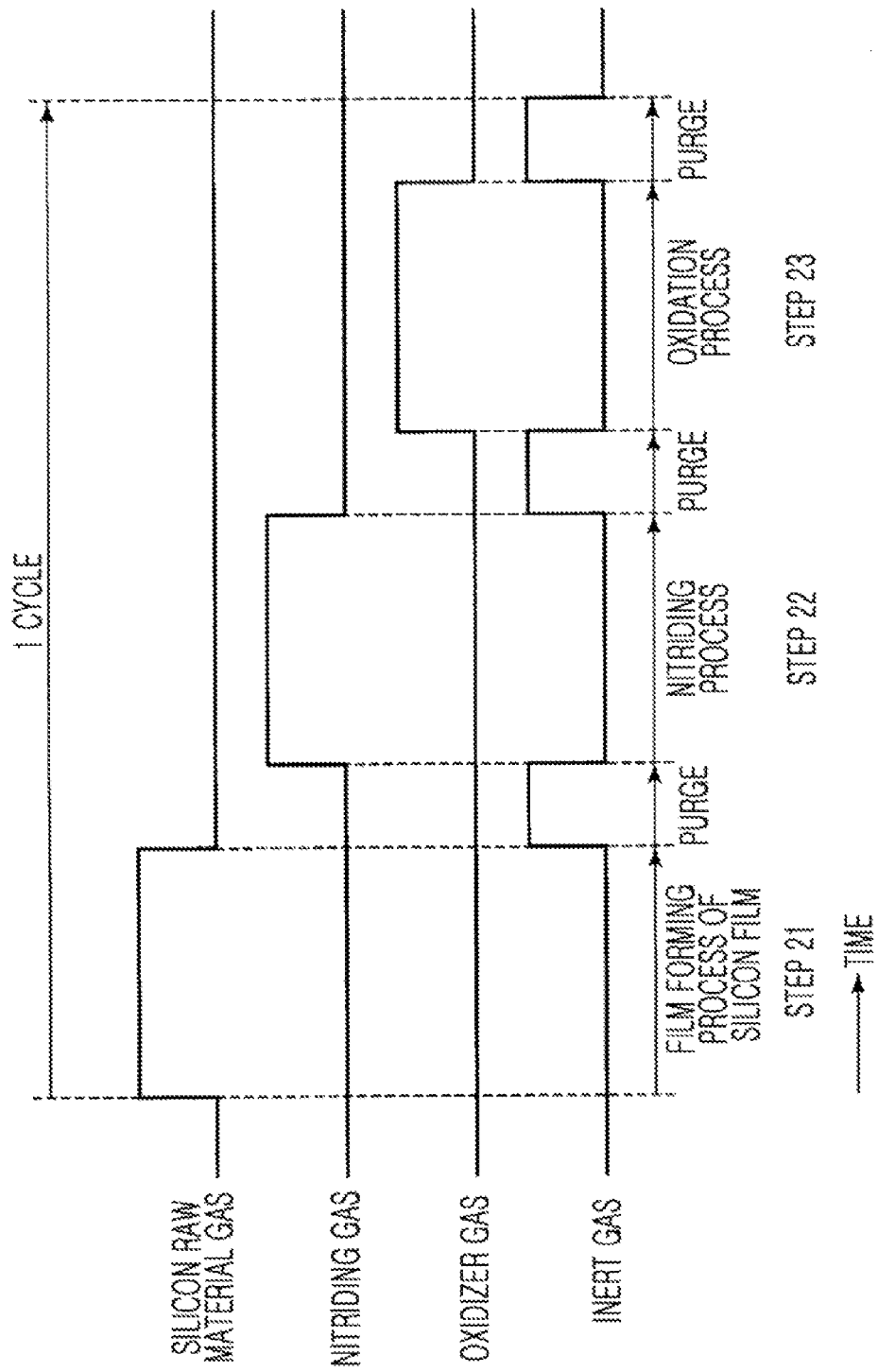

METHOD OF FORMING SILICON OXYCARBONITRIDE FILM

CROSS-REFERENCE TO RELATED PATENT APPLICATIONS

This application claims the benefit of Japanese Patent Application No. 2011-286342, filed on Dec. 27, 2011, in the Japan Patent Office, the disclosure of which is incorporated herein in its entirety by reference.

BACKGROUND OF THE INVENTION

1. Field of the Invention

The present invention relates to a method of forming a silicon oxycarbonitride film.

2. Description of the Related Art

Accompanying the miniaturization of semiconductor integrated circuit devices from 3X nm-node to 2X nm-node, and from 2X nm-node to further, a parasitic capacitance around a gate electrode has become considerable. A side wall insulating film is formed around the gate electrode. There are some kinds of side wall insulating films, such as a stress liner, an offset spacer, a side wall spacer, and the like, and a silicon nitride film (SiN film) is used mostly as the side wall insulating film. A silicon nitride film has a relative dielectric constant that is higher than that of a silicon oxide film ($SiO_2$ film). Thus, it is required to form a side wall insulating film having a low dielectric constant, in particular, to replace it with an insulating film having a relative dielectric constant that is equal to or less than that of a silicon nitride film.

In order to obtain the side wall insulating film having a low dielectric constant, a few insulating films have been researched, one of which is a silicon oxycarbonitride (SiOCN film). For example, Patent reference 1 discloses a silicon oxycarbonitride film.

Although Patent Reference 1 discloses a method of forming a silicon oxycarbonitride film, there is no disclosure about applying the silicon oxycarbonitride film as a side wall insulating film.

The side wall insulating film is formed around a gate electrode by processing an insulating film using an anisotropic dry etching method, such as a reactive-ion etching (RIE) method. The side wall insulating film is exposed to various etching processes during the manufacturing of a semiconductor integrated circuit device.

For example, when applying a salicide process to a gate electrode, a source diffusion layer, and a drain diffusion layer, the side wall insulating film is exposed to a wet etching process after performing dry etching before forming a metal layer. After that, when removing a non-reacted portion of the metal layer, the side wall insulating film is exposed to a dry etching or a wet etching.

In addition, in a case where a self-aligning contact technique is used, the side wall insulating film is exposed to an anisotropic dry etching process such as an RIE method when forming a contact hole as an interlayer insulation film.

As described above, since an insulating film used as the side wall insulating film has to be processed on the side wall, excellent workability, as well as a dry etching resistance or a wet etching resistance, are necessary.

3. Prior Art Reference (Patent Reference 1) Japanese Laid-open Patent Publication No. 2011-192875

SUMMARY OF THE INVENTION

According to an aspect of the present invention, there is provided a method of forming a silicon oxycarbonitride film on a base, the method including stacking a silicon carbonitride film and a silicon oxynitride film on the base to form the silicon oxycarbonitride film.

Additional objects and advantages of the invention will be set forth in the description which follows, and in part will be obvious from the description, or may be learned by practice of the invention.

The objects and advantages of the invention may be realized and obtained by means of the instrumentalities and combinations particularly pointed out hereinafter.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

FIG. 11 is a timing chart showing an example of a gas discharge timing;

DETAILED DESCRIPTION OF THE INVENTION

Figure 1:
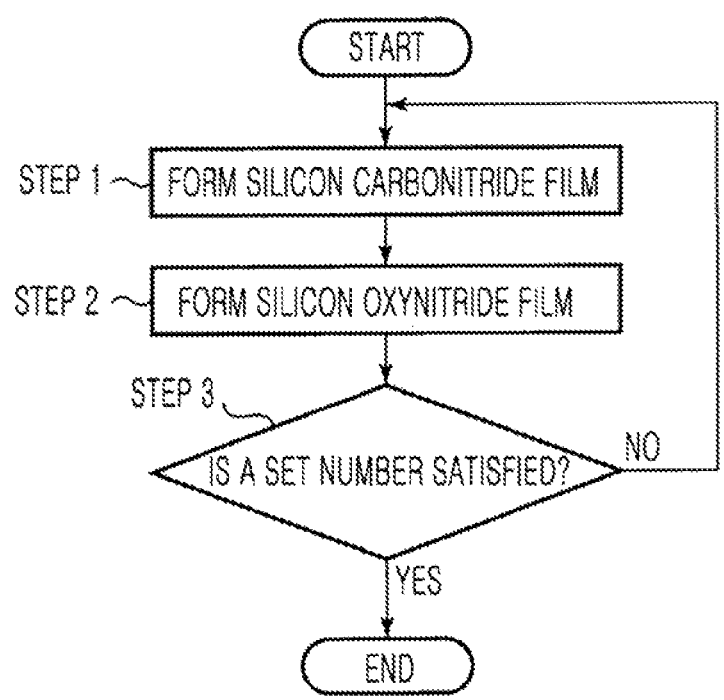
FIG. 1 is a flowchart describing a method of forming a silicon oxycarbonitride film, according to a first embodiment of the present invention.

An embodiment of the present invention achieved on the basis of the findings given above will now be described with reference to the accompanying drawings. In the following description, the constituent elements having substantially the same function and arrangement are denoted by the same reference numerals, and a repetitive description will be made only when necessary.

Hereinafter, embodiments of the present invention will be described with reference to accompanying drawings. Like reference numerals in the drawings denote like elements.

(First Embodiment)

FIG. 1 is a flowchart describing a method of forming a silicon oxycarbonitride film, according to a first embodiment of the present invention, and FIGS. 2A through 2E are cross-sectional views for describing main processes in the method of forming a silicon oxycarbonitride film, according to the first embodiment.

Figure 2A:
FIGS. 2A through 2E are cross-sectional views showing main processes in the method of forming a silicon oxycarbonitride film according to the first embodiment of the present invention.

First, as shown in FIG. 2A, a semiconductor substrate is prepared. In the present embodiment, a silicon wafer 1 is used as the semiconductor substrate. In addition, the silicon wafer 1 is accommodated in a processing chamber of a film forming apparatus.

Figure 2B:
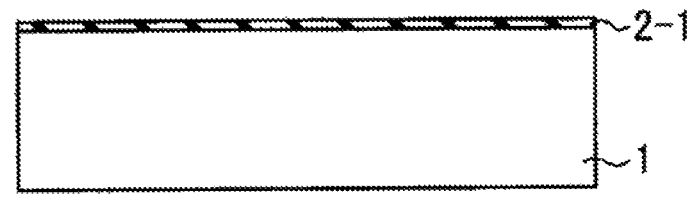

Next, as shown in step 1 of FIG. 1 and FIG. 2B, a silicon carbonitride film (SiCN film) 2-1 is formed on a base, in the present embodiment, a processing target surface of the silicon wafer 1.

Figure 2C:
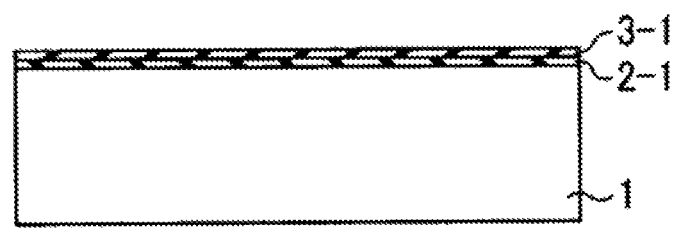

Next, as shown in step 2 of FIG. 1 and FIG. 2C, a silicon oxynitride film 3-1 is formed on the silicon carbonitride film 2-1 so that the silicon carbonitride film 2-1 and the silicon oxynitride film 3-1 are stacked.

Then, as shown in step 3 of FIG. 1, it is determined whether the number of stacking operations has reached a predetermined number. If the number of stacking operations has reached the predetermined number (YES), a formation of the silicon oxycarbonitride film is terminated. If the number of stacking operation is "1", the silicon oxycarbonitride film (SiOCN film) may be formed by stacking the silicon carbonitride film 2-1 and the silicon oxynitride film 3-1. If the number of stacking operation is fixed to "1", step 3 may be omitted.

Figure 2D:
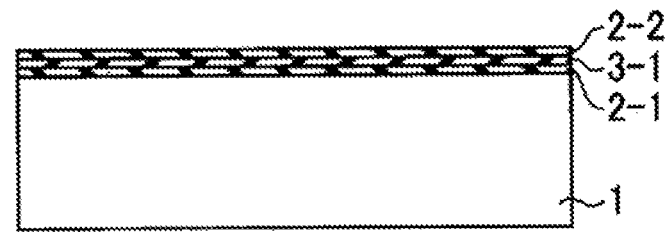

If the number of stacking operations has not reached the predetermined number (NO), the method goes back to step 1, and as shown in FIG. 2D, a second-layer silicon carbonitride film 2-2 is formed on the silicon oxynitride film 3-1.

Figure 2E:
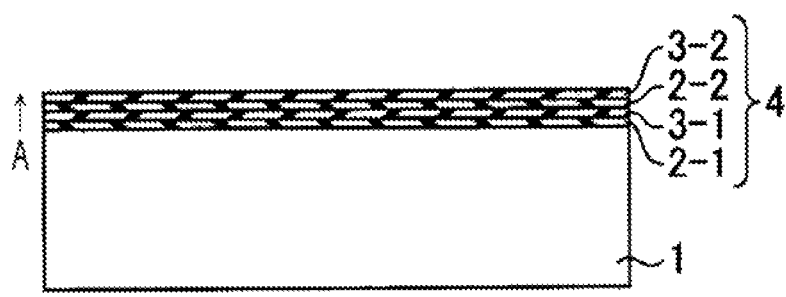

Then, as shown in step 2 of FIG. 1 and FIG. 2E, a second-layer silicon oxynitride film 3-2 is formed.

Next, as shown in step 3 of FIG. 1, it is determined again whether the number of stacking operations has reached the predetermined number. If the number of stacking operations has reached the predetermined number (Yes), the formation of the silicon oxycarbonitride film is terminated, and if the number of stacking operations has not reached the predetermined number (No), step 1 and step 2 of FIG. 1 are repeatedly performed until the number of stacking operations reaches the predetermined number. As such, a silicon oxycarbonitride film 4 is formed.

According to the method of forming a silicon oxycarbonitride film of the first embodiment, the silicon carbonitride films 2 and the silicon oxynitride films 3 are stacked on the base to form the silicon oxycarbonitride film 4. As described above, when the silicon oxycarbonitride film 4 is formed by stacking the silicon carbonitride film 2 and the silicon oxynitride film 3, a concentration of oxygen (O), a concentration of carbon (C), and a concentration of nitrogen (N) in the formed silicon oxycarbonitride film 4 may be accurately adjusted throughout an entire film thickness direction A (refer to FIG. 2E) that is perpendicular to the processing target surface.

The present inventors found that the concentration of the oxygen, in particular, in the silicon oxycarbonitride film 4, is closely related to the wet etching resistance and the dry etching resistance of the silicon oxycarbonitride film 4.

Figure 3:
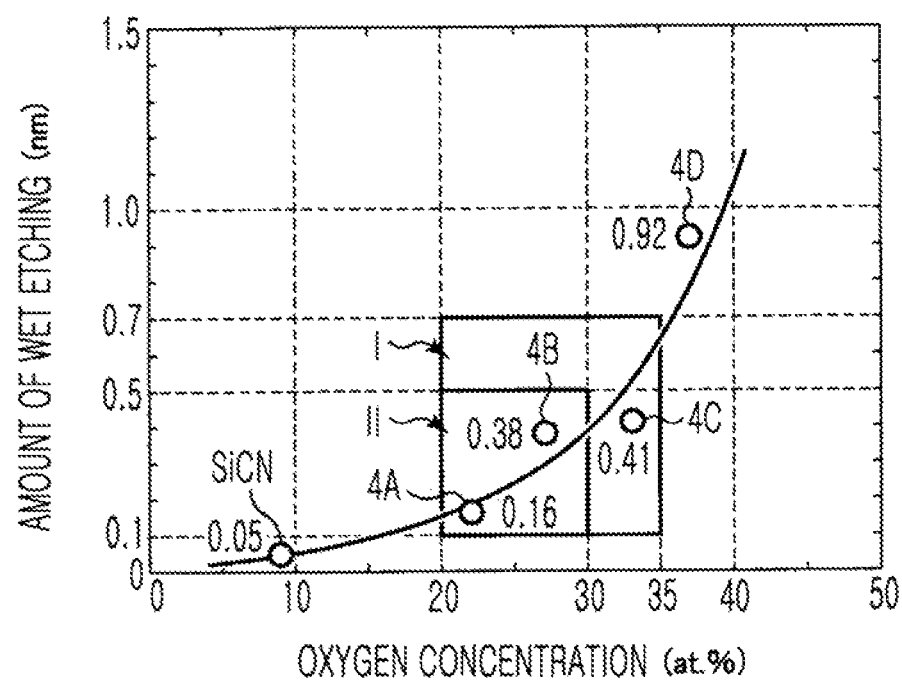
FIG. 3 is a graph showing an oxygen concentration versus an amount of wet etching.
Figure 4:
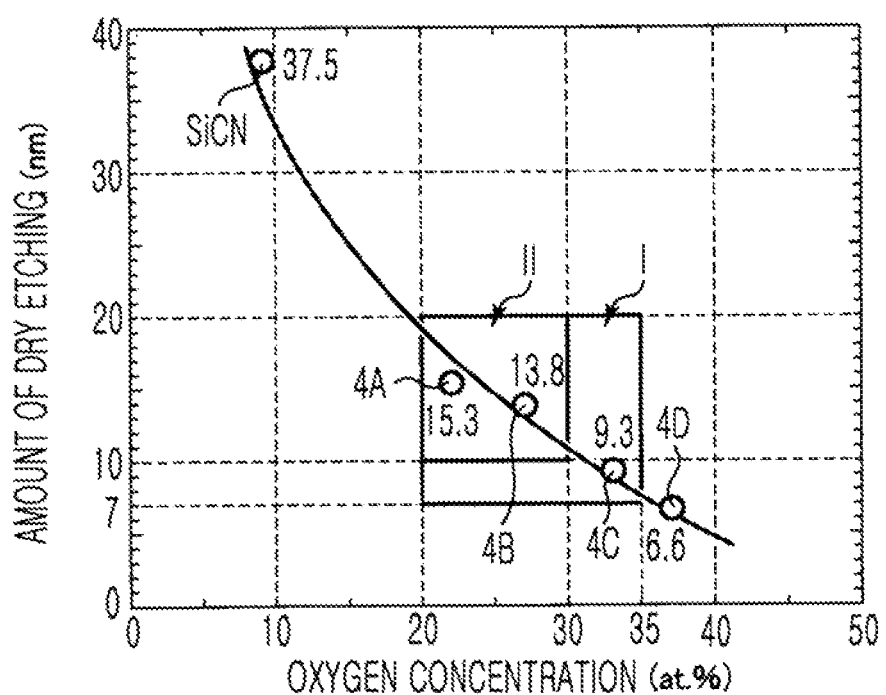
FIG. 4 is a graph showing an oxygen concentration versus an amount of dry etching.

FIG. 3 is a graph showing a relation between the concentration of oxygen and an amount of wet etching, and FIG. 4 is a graph showing a relation between the concentration of oxygen and an amount of dry etching. In FIGS. 3 and 4, a silicon carbonitride film (no intentional oxygen induction; however, including about 8.8% oxygen, which is an amount of a native oxide film on the silicon wafer) is shown as a comparative example, for convenience of description about the silicon oxycarbonitride film according to the first embodiment.

Conditions for performing a wet etching are as follows:
Etchant: diluted HF ($H_2O$:HF=100:1)
Processing time: 60 sec.

Also, conditions for performing a dry etching are as follows:
Etchant: mixture gas of $CHF_3$, $CF_4$, and $O_2$
Processing time: 5 sec.

As shown in FIG. 3, the silicon carbonitride film (SiCN film) is rarely etched by the diluted HF. Like in the first embodiment, when oxygen is intentionally introduced to form the silicon oxycarbonitride film 4 and the concentration of oxygen in the silicon oxycarbonitride film 4 increases, the silicon oxycarbonitride film 4 is likely to be etched by the diluted HF. That is, when the concentration of oxygen in the silicon oxycarbonitride film 4 is low, the wet etching resistance is increased.

Next, as shown in FIG. 4, the silicon carbonitride film (SiCN film) is largely etched by the mixture gas of $CHF_3$, $CF_4$, and $O_2$. However, when the silicon oxycarbonitride film 4 is formed and the concentration of oxygen in the silicon oxycarbonitride film 4 increases, it becomes difficult to etch the silicon oxycarbonitride film 4 by the mixture gas of $CHF_3$, $CF_4$, and $O_2$. That is, when the concentration of oxygen in the silicon oxycarbonitride film 4 is increased, the dry etching resistance is increased.

Figure 5:
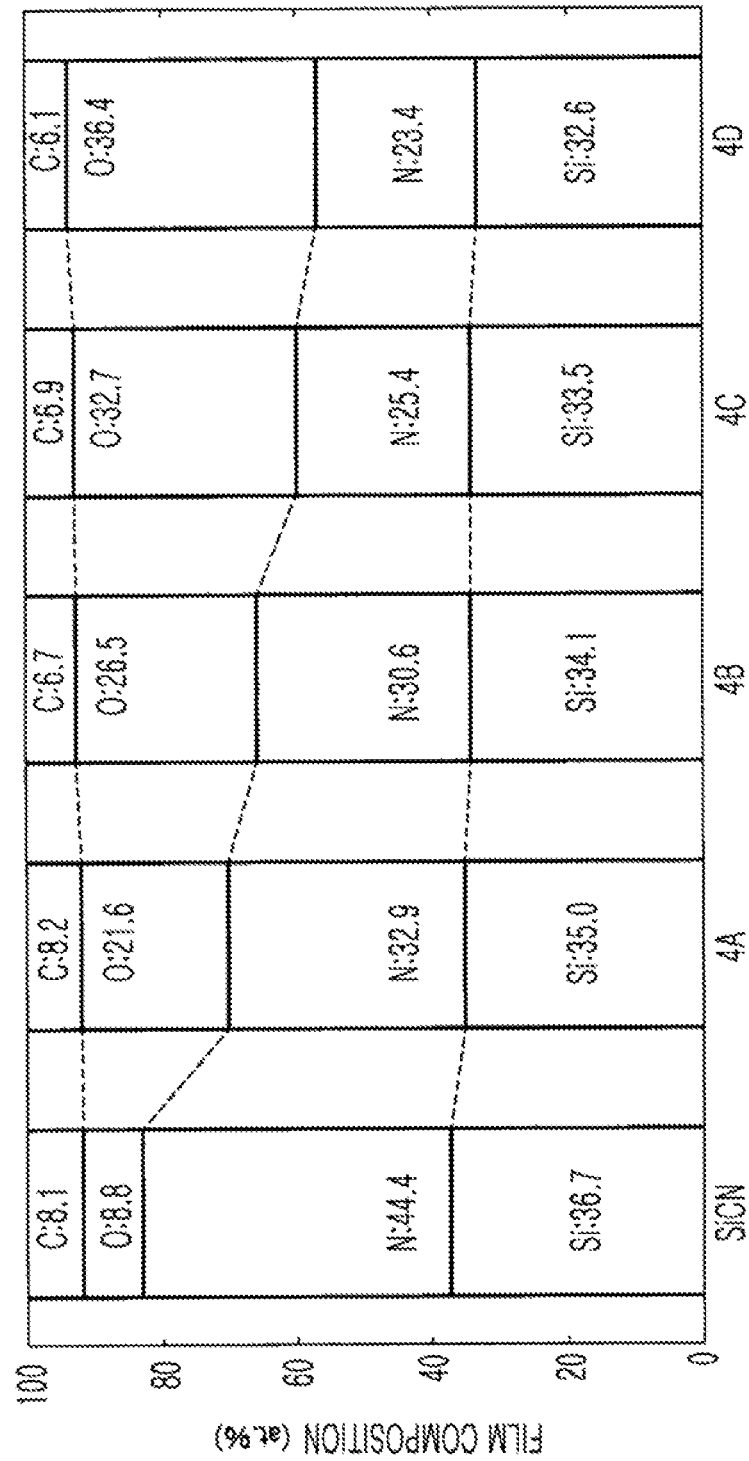
FIG. 5 is a diagram showing a film composition of a silicon oxycarbonitride film having the oxygen concentration of FIGS. 3 and 4, and a film composition of a silicon carbonitride film as a comparative example.

In addition, FIG. 5 shows a film composition of the silicon oxycarbonitride film 4 having the oxygen concentration shown in FIGS, 3 and 4, and a film composition of the silicon carbonitride film as a comparative example. A film composition is analyzed by using an X-ray photoelectron spectroscopy (XPS) method. In FIG. 5, SiCN and silicon oxycarbonitride films 4A through 4D respectively correspond to the SiCN and the silicon oxycarbonitride films 4A through 4D of FIGS. 3 and 4.

In FIG. 5, although oxygen atoms are shown in the film composition of the silicon carbonitride film, they exist in a native oxide film formed on a surface of the silicon wafer. In addition, a sum of the film composition is not 100 at. %, but 97.7 at. % to 98.5 at. % because atoms other than silicon atoms, oxygen atoms, nitrogen atoms, and carbon atoms introduced in the film during forming the film are observed.

As described above, the concentration of oxygen in the silicon oxycarbonitride film 4 affects each of the wet etching resistance and the dry etching resistance of the silicon oxycarbonitride film 4.

According to the method of forming a silicon oxycarbonitride film of the first embodiment, as described above, since the silicon oxycarbonitride film 4 is formed by stacking the silicon carbonitride film 2 and the silicon oxynitride film 3, the concentration of oxygen, the concentration of carbon, and the concentration of nitrogen in the silicon oxycarbonitride film 4 may be precisely controlled throughout the entire film thickness direction A. The concentration of the oxygen may be controlled by adjusting an amount of film formation of the silicon oxynitride film 3, the concentration of the carbon may be controlled by adjusting an amount of film formation of the silicon carbonitride film 2, and the concentration of the nitrogen may be controlled by adjusting both of the amount of film formation of the silicon oxynitride film 3 and the amount of film formation of the silicon carbonitride film 2.

Therefore, according to the first embodiment, by controlling the concentration of the oxygen, for example, (1) a silicon oxycarbonitride film having excellent wet etching resistance in particular, (2) a silicon oxycarbonitride film having excellent dry etching resistance in particular, and (3) a silicon oxycarbonitride film having an easiness in a processing, and both of the wet etching resistance and the dry etching resistance within a practically applicable range may be fabricated accurately and classified according to usage, respectively.

The easiness in a processing is obtained when an etching is performed to some degree. The silicon carbonitride film is rarely etched in the wet etching process by using the diluted HF. It means that the silicon carbonitride film has excellent wet etching resistance but the silicon carbonitride film is rarely etched in the wet etching process by using the diluted HF. This also denotes that it is not easy to process the silicon carbonitride film in the wet etching process.

For example, from the results shown in FIGS. 3 and 4, in a case where the wet etching resistance is desired to be set so that an etching amount ranges from 0.1 nm to about 0.7 nm when the wet etching is performed for 60 seconds by using the diluted HF ($H_2O$:HF=100:1) and in a case where the dry etching resistance is desired to be set so that an etching amount ranges from 7 nm to 20 nm when the dry etching is performed for 5 seconds by using the mixture gas of $CHF_3$, $CF_4$, and $O_2$, the concentration of the oxygen included in the silicon oxycarbonitride film 4 may be preferably adjusted within a range from 20 at. % to 35 at. % (Range I). Accordingly, the silicon oxycarbonitride film 4 having easiness in a processing and having both of the wet etching resistance and the dry etching resistance within the practically applicable range may be obtained.

Also, more strictly, in a case where the wet etching resistance is desired to be set so that the etching amount ranges from 0.1 nm to 0.5 nm when the wet etching is performed for 60 seconds by using the diluted HF ($H_2O$:HF=100:1) and in a case where the dry etching resistance is set so that the etching amount ranges from 10 nm to 20 nm when the dry etching is performed for 5 seconds by using the mixture gas of $CHF_3$, $CF_4$, and $O_2$, the concentration of the oxygen included in the silicon oxycarbonitride 4 may be preferably adjusted within a range from 20 at. % to 30 at. % (Range II). Accordingly, the silicon oxycarbonitride film 4 having easiness in a processing and having both of the wet etching resistance and the dry etching resistance within the practically applicable range may be obtained.

Also, it was determined that there is a correlation between the concentration of oxygen in the silicon oxycarbonitride film 4 and a refractive index.

Figure 6:
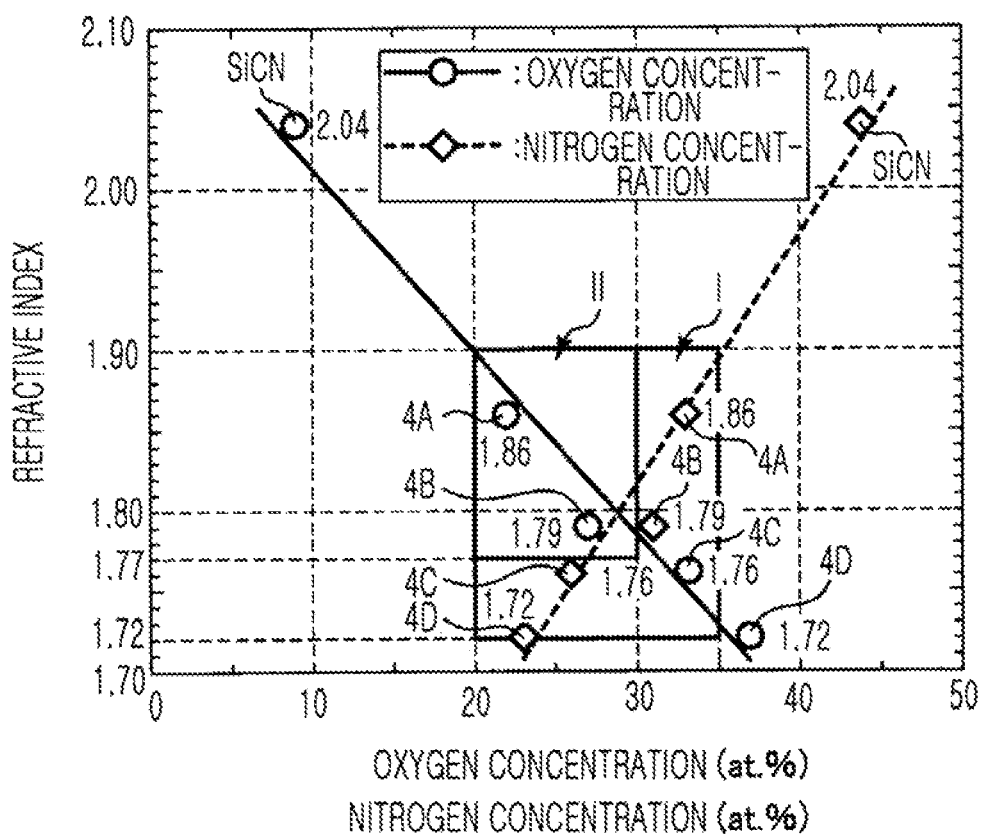
FIG. 6 is a graph showing a relation between an oxygen concentration and a refractive index.

FIG. 6 is a graph showing a relation between the concentration of oxygen in the silicon oxycarbonitride film and the refractive index. The refractive index of the silicon oxycarbonitride 4 shown in FIG. 6 was measured by using an ellipsometer (manufactured by Rudolph Technologies, S3000, He—Ne laser: wavelength 633 nm).

As shown in FIG. 6, as the concentration of the oxygen included in the silicon oxycarbonitride film 4 increases, the refractive index of the silicon oxycarbonitride film 4 is close to "1". For example, the silicon carbonitride film has a refractive index of about 2.04; however, the silicon oxycarbonitride film 4 is formed by introducing oxygen intentionally and increasing the oxygen concentration, and then, the refractive index approaches close to "1" linearly, that is, about 1.86 (oxygen concentration of about 22 at. %), about 1.79 (oxygen concentration of about 27 at. %), about 1.76 (oxygen concentration of about 33 at. %), and about 1.72 (oxygen concentration of about 37 at. %). In this point of view, the oxygen concentration of the silicon oxycarbonitride film 4 may be defined by measuring the refractive index of the silicon oxycarbonitride film 4 using the ellipsometer, not using an XPS method.

For example, if the refractive index of a film ranges from about 1.72 to 1.90 when a wavelength of light is 633 nm, the film may be defined as the silicon oxycarbonitride film 4 having the oxygen concentration ranging from 20 at. % to 35 at. %, that is, the range I shown in FIGS. 3 and 4. Likewise, if the refractive index of a film ranges from about 1.77 to 1.90 when the wavelength of light is 633 nm, the film may be defined as the silicon oxycarbonitride film 4 having the oxygen concentration ranging from 20 at. % to 30 at. %, that is, the range II shown in FIGS. 3 and 4.

Also, FIG. 6 simultaneously shows a correlation between the oxygen concentration and the nitrogen concentration.

As shown in FIG. 6, the silicon oxycarbonitride film 4A having a refractive index of about 1.86 has a film composition having a low oxygen concentration and a high nitrogen concentration (nitrogen rich), that is, an oxygen concentration of about 22 at. % and a nitrogen concentration of about 33 at. %. Likewise, the silicon oxycarbonitride film 4B having a refractive index of about 1.79 has a film composition having a low oxygen concentration and a high nitrogen concentration (nitrogen rich), that is, an oxygen concentration of about 27 at. % and a nitrogen concentration of about 31 at. %.

Also, the silicon oxycarbonitride film 4C having a refractive index of about 1.76 that is further approximately "1" has a film composition having a high oxygen concentration and a low nitrogen concentration (oxygen rich), that is, an oxygen concentration of about 33 at. % and a nitrogen concentration of about 25 at. %. The silicon oxycarbonitride film 4D having a refractive index of about 1.72 has a film composition having an oxygen concentration of about 37 at. % and a nitrogen concentration of about 23 at. % (oxygen rich).

As described above, the silicon oxycarbonitride film 4 formed by the method according to the first embodiment has a characteristic that the nitrogen concentration is lowered when the oxygen concentration is increased.

According to the first embodiment, since the silicon oxycarbonitride film 4 is formed by stacking the silicon carbonitride film 2 and the silicon oxynitride film 3, the concentration of oxygen in the silicon oxycarbonitride film may be accurately controlled along the film thickness direction A, and thus, the method of forming a silicon oxycarbonitride film, which is capable of obtaining excellent workability and controlling the dry etching resistance and the wet etching resistance, may be obtained.

Also, according to the first embodiment, since the silicon oxycarbonitride film 4 is formed by stacking the silicon carbonitride film 2 and the silicon oxynitride film 3, an oxidizing agent and a carbonizing agent may not be necessarily introduced in the processing chamber at the same time. The carbonizing agent may be a hydrocarbon-based carbonizing agent: however, ethylene ($C_2H_4$) that is cheap and easy to get is likely to react with the oxidizing agent. Thus, if ethylene is introduced simultaneously with the oxidizing agent in the processing chamber, it may be difficult to accurately control the concentration of the oxygen in the formed silicon oxycarbonitride film.

The above problem can be addressed by separately forming the silicon carbonitride film 2 and the silicon oxynitride film 3 and forming the silicon oxycarbonitride film 4 by stacking the silicon carbonitride film 2 and the silicon oxynitride film 3, like the first embodiment.

Also, when the oxidizing agent and the carbonizing agent are not simultaneously introduced in the processing chamber, there is an advantage that safety and a degree of freedom in selecting the oxidizing agent and the carbonizing agent is improved, That is, in a case where the oxidizing agent and the carbonizing agent are introduced simultaneously in the processing chamber, there exists a combination of the oxidizing agent and the carbonizing agent that cannot be done due to the safety. However, in the first embodiment in which the silicon carbonitride film 2 and the silicon oxynitride film 3 are separately formed, the above combination of the oxidizing agent and the carbonizing agent may be used because the silicon carbonitride film 2 and the silicon oxynitride film 3 are separately formed and stacked.

Next, examples of forming the silicon carbonitride film 2 and the silicon oxynitride film 3 will be described below in more detail.

(Method of Forming the Silicon Carbonitride Film 2)

Figure 7:
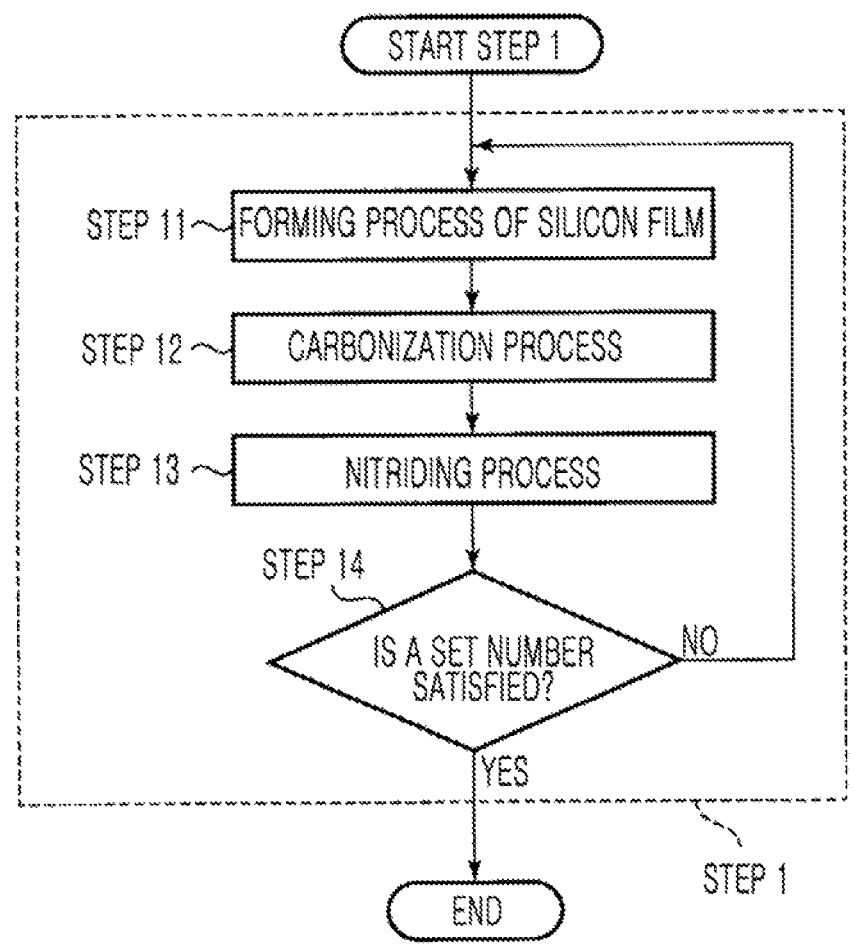
FIG. 7 is a flowchart describing an example of a method of forming a silicon carbonitride film used in step 1 of the first embodiment of the present invention.
Figure 8:
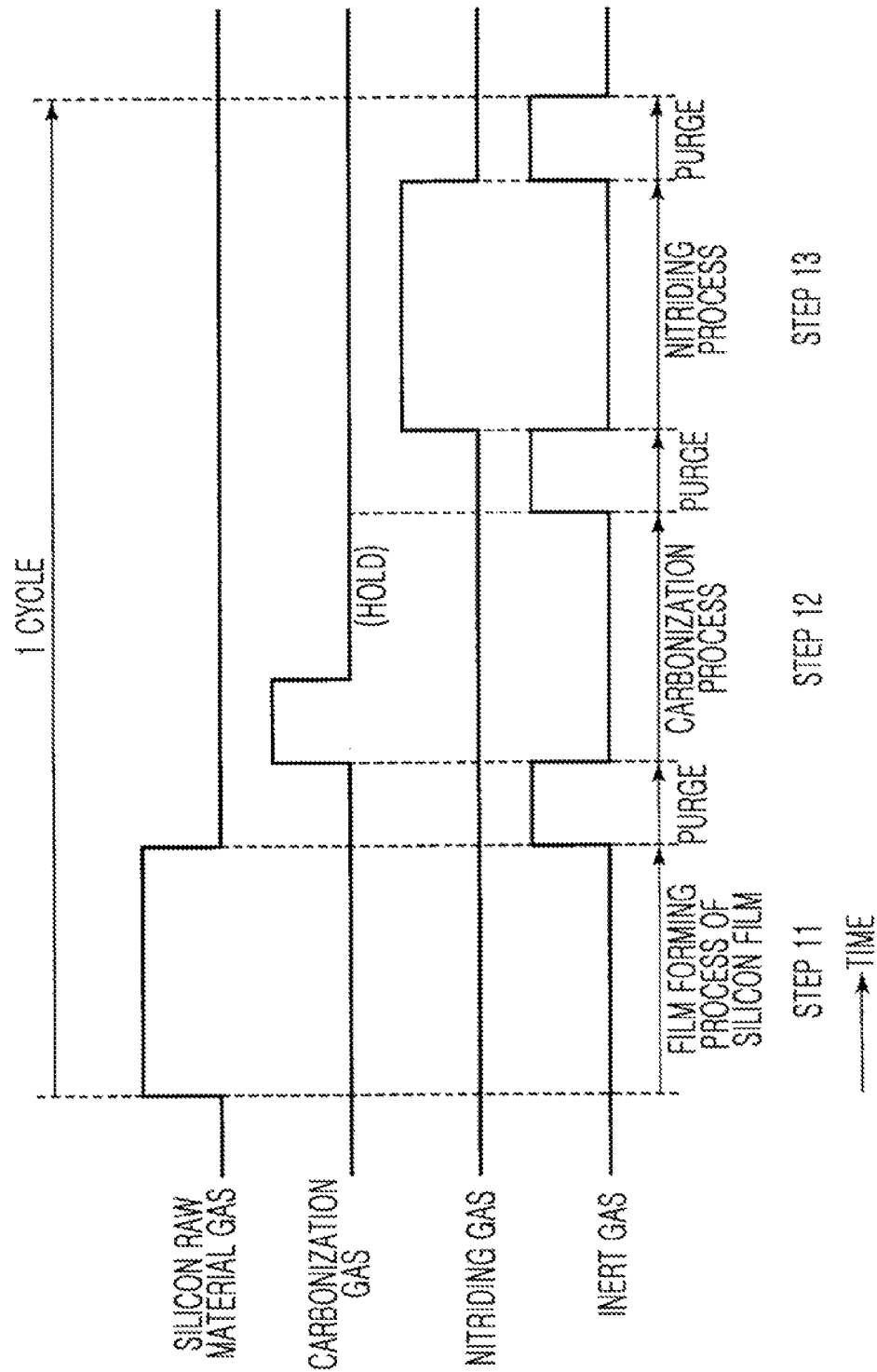
FIG. 8 is a timing chart showing an example of a gas discharge timing.

FIG. 7 is a flowchart describing an example of a method of forming a silicon carbonitride film, which is used in step 1 of the above first embodiment. FIG. 8 is a timing chart showing an example of gas discharge timing, and FIGS. 9A through 9C are cross-sectional views describing main processes of the method of forming a silicon carbonitride film.

Figure 9A:
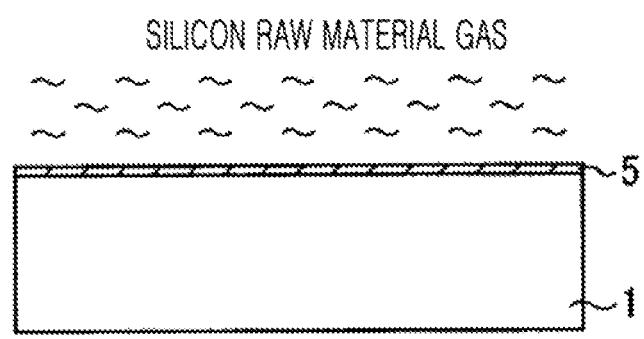
FIGS. 9A through 9C are cross-sectional views showing main processes in the method of forming a silicon carbonitride film according to the embodiment of the present invention.
Figure 9B:
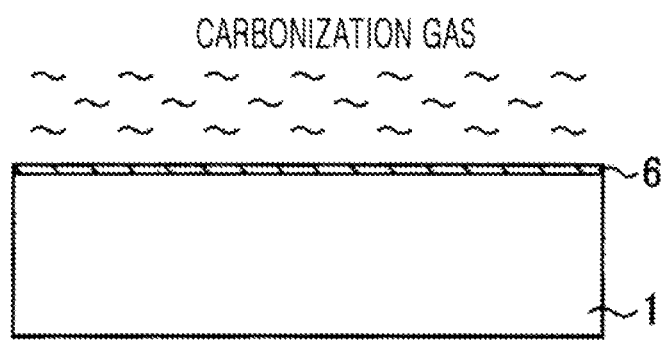
Figure 9C:
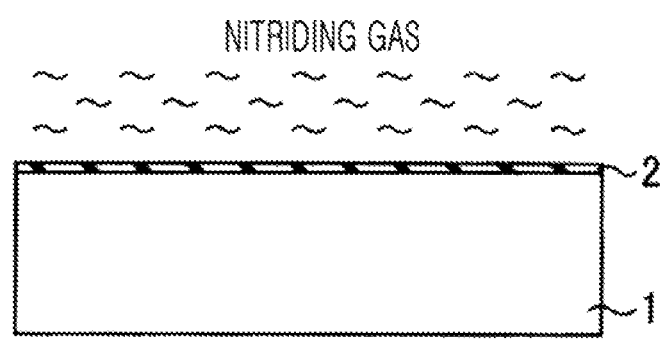

First, as shown in step 11 of FIG. 7, FIG. 8, and FIG. 9A, a silicon raw material gas is flowed into a processing chamber (not shown) of a film forming apparatus in which the silicon wafer 1 is accommodated in order to form a silicon adsorption layer 5 on a processing target surface of the silicon wafer 1.

An example of processing conditions when forming the silicon adsorption layer 5 is as follows:
 Silicon raw material gas: dichlorosilane ($SiH_2Cl_2$: DCS)
 Flow rate of the silicon raw material gas: 500 to 3000 sccm
 Processing time: 0.05 to 1.0 min.
 Process temperature: 450 to 630° C.
 Process pressure: 13.3 to 1064Pa (0.1 to 8.0 Torr)

According to the above processing conditions, the silicon adsorption layer 5 having a film thickness of about 0.3 to about 1.0 nm is formed on the processing target surface of the silicon wafer 1.

When the operation of step 11 is completed, the processing chamber is purged by using an inert gas to substitute an internal atmosphere in the processing chamber with an inert gas environment. An example of the inert gas is an $N_2$ gas.

Next, as shown in step 12 of FIG. 7, FIG. 8, and FIG. 9B, a carbonization gas is flowed into the processing chamber and is applied to the silicon adsorption layer 5 formed on the processing target surface of the silicon wafer 1 to form a silicon carbide film (SiC) 6.

An example of processing conditions when carbonizing the silicon adsorption layer 5 is as follows:
 Carbonization gas: ethylene ($C_2H_4$)
 Flow rate of the carbonization gas: 3000 sccm
 Processing time: 0.5 to 1.5 min
 (supplying time of the carbonization gas: about 0.05 to 0.2 min., holding time 0.2 to 1.3 min.)
 Processing temperature: 450 to 630° C.
 Processing pressure: 133 to 665 Pa (1.0 to 5.0 Torr)

When the operation of step 12 is finished, the processing chamber is purged by using an inert gas to substitute the internal atmosphere in the processing chamber with an inert gas atmosphere, in the present embodiment, an $N_2$ gas atmosphere.

Next, as shown in step 13 of FIG. 7, FIG. 8, and FIG. 9C, a nitriding gas is flowed into the processing chamber, and then, the silicon carbide film 6 formed on the processing target surface of the silicon wafer 1 is nitrided into the silicon carbonitride film (SiCN) 2.

An example of processing conditions when nitriding the silicon carbide film 6 is as follows:
 Nitriding gas: ammonia ($NH_3$)
 Flow rate of nitriding gas: 5000 to 10000 sccm
 Processing time: 0.2 to 1.0 min.
 Processing temperature: 450 to 630° C.
 Processing pressure: 13.3 to 66.5 Pa (0.1 to 0.5 Torr)

When the operation of step 13 is finished, the processing chamber is purged by using the inert gas to substitute the internal atmosphere in the processing chamber with an inert gas atmosphere, in the present embodiment, an $N_2$ gas atmosphere. Up to this point, one cycle of a sequence of forming the silicon carbonitride film 2 is finished.

Next, as shown in step 14 of FIG. 7, it is determined whether the number of cycles is the set number. If the number of cycles has reached the set number (Yes), the formation of the silicon carbonitride film 2 is finished. If the number of cycles has not reached the set number (No), the method returns to step 11, and operations of step 11 through step 13 are repeatedly performed.

In the present embodiment, the number of cycles is set, in particular, according to the carbon concentration of the silicon oxycarbonitride film 4 that is formed. Also, if the number of cycles is fixed to "1", the operation of step 14 may be omitted.

For example, as such, the silicon carbonitride film 2 is formed.

(First Example of the Method of Forming the Silicon Oxynitride Film 3)

Figure 10:
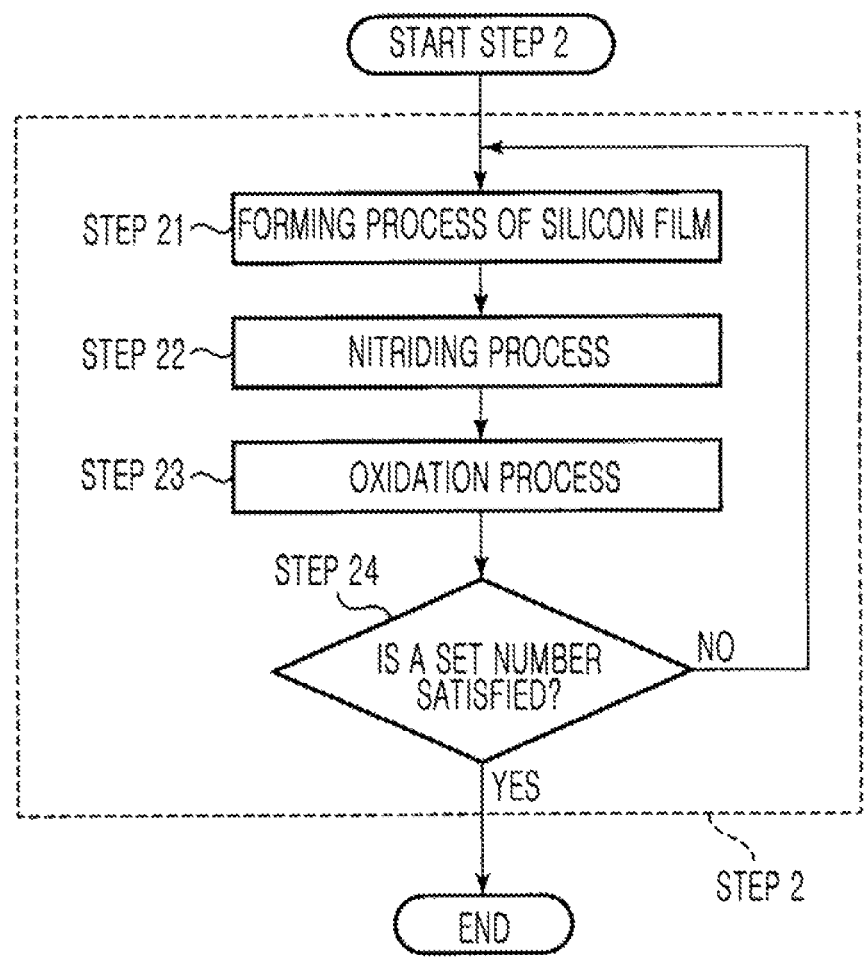
FIG. 10 is a flowchart describing a first example of a method of forming a silicon oxynitride film used in step 2 according to the first embodiment of the present invention.

FIG. 10 is a flowchart describing a first example of the method of forming the silicon oxynitride film 3 in step 2 of the method of forming a silicon oxycarbonitride film according to the first embodiment. FIG. 11 is a timing chart showing an example of a gas discharge timing, and FIGS. 12A through 12C are cross-sectional views describing main processes of the method of forming a silicon oxynitride film according to the present example.

Figure 12A:
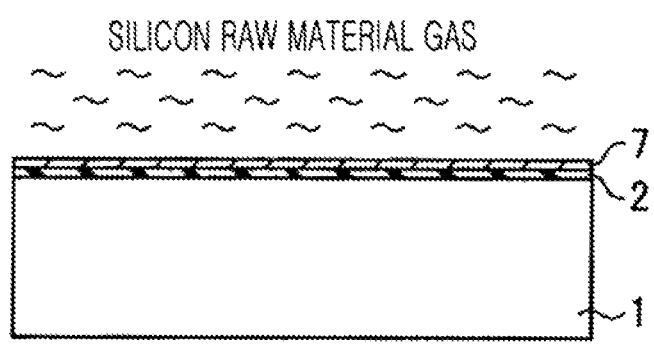
FIGS. 12A through 12C are cross-sectional views showing main processes in the method of forming a silicon oxynitride film according to the embodiment of the present invention.
Figure 12B:
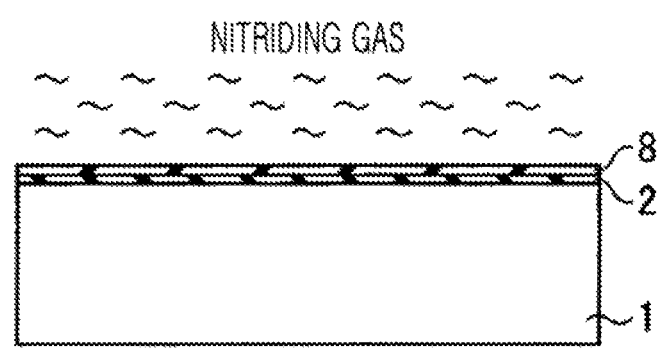
Figure 12C:
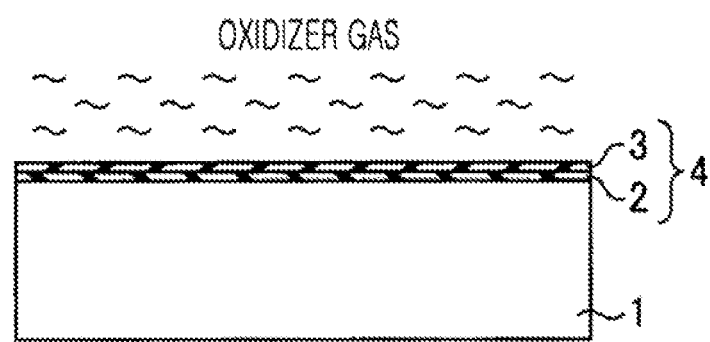

First, as shown in step 21 of FIG. 10, FIG. 11, and FIG. 12A, a silicon raw material gas is flowed into a processing chamber (not shown) of a film forming apparatus in which a silicon wafer 1 is accommodated to form a silicon adsorption layer 7 on the silicon carbonitride film 2.

An example of processing conditions when forming the silicon adsorption layer 7 is as follows:
 Silicon raw material gas: dichlorosilane ($SiH_2Cl_2$: DCS)
 Flow rate of the silicon raw material gas: 500 to 3000 sccm
 Processing time: 0.05 to 1.0 min.
 Process temperature: 450 to 630° C.
 Process pressure: 13.3 to 1064 Pa (0.1 to 8.0 Torr)

According to the above processing conditions. the silicon adsorption layer 7 having a film thickness of about 0.3 to 1.0 nm is formed on the silicon carbonitride film 2.

When the operation of step 21 is finished, the processing chamber is purged by using the inert gas to substitute the internal atmosphere in the processing chamber with an inert gas atmosphere, in the present embodiment, an $N_2$ gas atmosphere.

Next, as shown in step 22 of FIG. 10, FIG. 11, and FIG. 12B, a nitriding gas is flowed into the processing chamber to nitride the silicon adsorption layer 7 to thus form a silicon nitride film (SiN) 8.

In this case, a nitriding amount of the silicon adsorption layer 7 may be a degree by which a nitrogen adsorption layer of a level less than that of a single atomic layer is formed, because silicon and carbon (Si—C), silicon and nitrogen (Si—N), silicon and oxygen (Si—O), and carbon and oxygen (C—O) are combined whereas nitrogen and oxygen (N—O) and carbon and nitrogen (C—N) are not combined. That is, when the nitrogen is sufficiently adsorbed by the surface of the silicon adsorption layer 7 and the silicon adsorption layer 7 is terminated with nitrogen, it is difficult to bond oxygen that is used in a next oxidation process to the silicon. To address the above problem, for example, the nitridation is performed so that a nitrogen adsorption layer that has a level less than a single atomic layer is formed on the silicon adsorption layer 7 and a gap is formed in the nitrogen adsorption layer so as to expose the silicon adsorption layer 7. By forming the gap, the oxygen used in the next oxidation process may be bonded to the silicon adsorption layer 7 exposed through the gap. Therefore, the silicon oxynitride film 3 may be easily formed without being accompanied with a reaction of substituting the nitrogen bonded to the silicon with the oxygen.

An example of processing conditions when nitriding the silicon adsorption layer 7 is as follows:

Nitriding gas: ammonia ($NH_3$)
Flow rate of nitriding gas: 5000 to 10000 sccm
Processing time: 0.2 to 1.0 min.
Processing temperature: 450 to 630° C.
Processing pressure: 13.3 to 66.5 Pa (0.1 to 0.5 Torr)

When the operation of step 22 is finished, the processing chamber is purged by using the inert gas to substitute the internal atmosphere in the processing chamber with an inert gas atmosphere, in the present embodiment, an $N_2$ gas atmosphere.

Next, as shown in step 23 of FIG. 10, FIG. 11, and FIG. 12C, an oxidizer gas is flowed into the processing chamber, and the silicon nitride film 8 is oxidated to form the silicon oxynitride film (SiON) 3.

An example of processing conditions when oxidating the silicon nitride film is as follows:

Oxidizer gas: oxygen ($O_2$)
Flow rate of oxidizer gas: 1000 to 10000 sccm
Processing time: 0.1 to 1.0 min.
Processing temperature: 450 to 630° C.
Processing pressure: 13.3 to 133 Pa (0.1 to 1.0 Torr)

When the operation of step 23 is finished, the processing chamber is purged by using the inert gas to substitute the internal atmosphere in the processing chamber with an inert gas atmosphere, in the present embodiment, an $N_2$ gas atmosphere. Up to this point, one cycle of a sequence of forming the silicon oxynitride film 3 is finished.

Next, as shown in step 24 of FIG. 10, it is determined whether the number of cycles has reached the set number. If the number of cycles has reached the set number (Yes), formation of the silicon oxynitride film 3 is terminated. If the number of cycles has not reached the set number (No), the method returns to step 21, and the operations of step 21 through step 23 are repeatedly performed.

In the present embodiment, the number of cycles is defined, in particular, according to the concentration of oxygen in the silicon oxycarbonitride film 4 that is formed. Also, if the number of cycles is fixed to "1", step 24 may be omitted.

As such, the silicon oxynitride film 3 is formed, for example. In addition, when the silicon oxynitride film 3 is stacked on the silicon carbonitride film 2, the silicon oxycarbonitride film 4 is formed.

(Second Example of the Method of Forming the Silicon Oxynitride Film 3)

Figure 13:
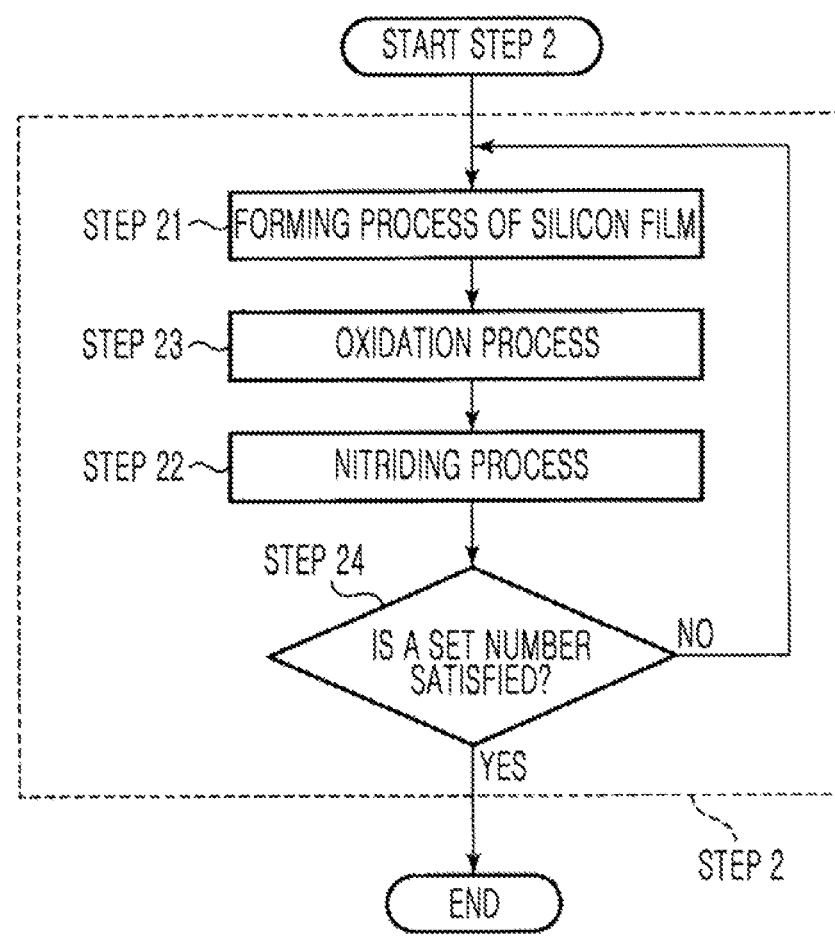
FIG. 13 is a flowchart describing a second example of the method of forming a silicon oxynitride film used in step 2 according to the first embodiment of the present invention.

FIG. 13 is a flowchart describing a second example of the method of forming the silicon oxynitride film 3 in step 2 of the method of forming a silicon oxycarbonitride film according to the first embodiment of the present invention.

As shown in FIGS. 10, 11, and 12A through 12C, in the first example, the silicon adsorption layer 7 is nitrided to form the silicon nitride film 8 (nitriding process of step 22), and the silicon nitride film 8 is oxidated to form the silicon oxynitride film 3 (oxidation process of step 23).

In the sequence of forming the silicon oxynitride film 3, the oxidation process of step 23 and the nitriding process of step 22 may be exchanged as shown in FIG. 13. That is, in the second example, the silicon adsorption layer 7 is oxidated to form a silicon oxide film (oxidation process of step 23), and the silicon oxide film is nitrided to form the silicon oxynitride film 3 (nitriding process of step 22).

Figure 14:
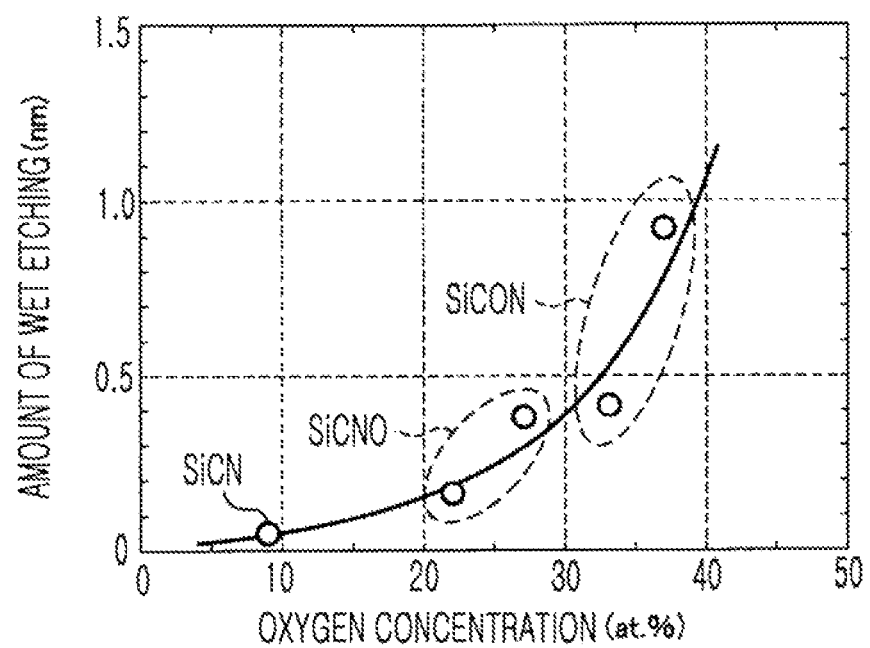
FIG. 14 is a graph showing a relation between an oxygen concentration and a wet etching amount.
Figure 15:
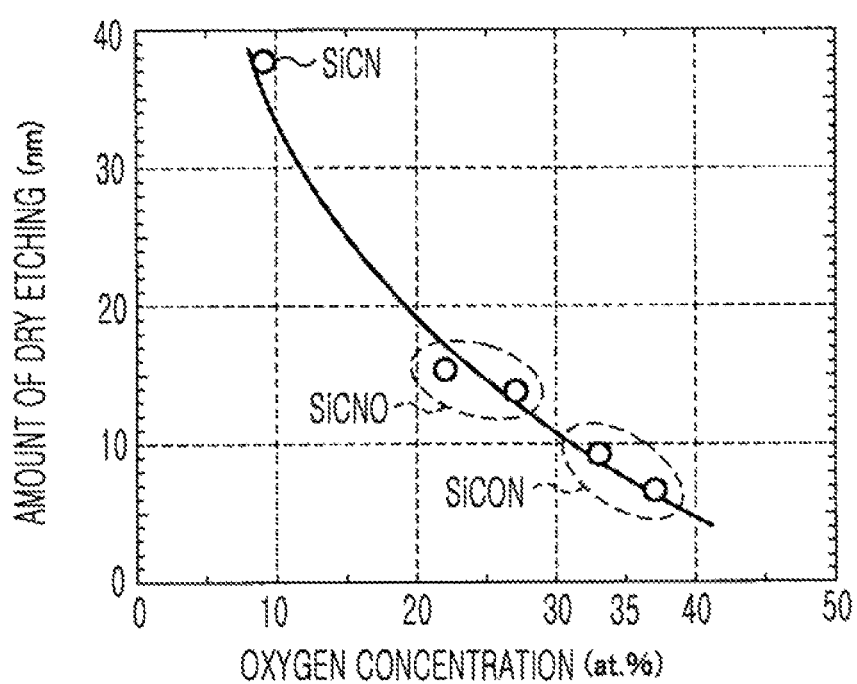
FIG. 15 is a graph showing a relation between an oxygen concentration and a dry etching amount.

FIGS. 14 and 15 show advantages when the first and second examples of the method of forming the silicon oxynitride film 3 are separately used. In FIGS. 14 and 15, the first example, in which the nitriding process of step 22 is performed first, is denoted as "SiCNO", and the second example, in which the oxidation process of step 23 is performed first, is denoted as "SiCON". Also, FIGS. 14 and 15, as the graphs of FIGS. 3 and 4, show the relation between the oxygen concentration and the wet etching amount and the relation between the oxygen concentration and the dry etching amount again.

As shown in FIGS. 14 and 15, in the silicon oxycarbonitride film 4 that is formed by nitriding the silicon adsorption layer 7 to form the silicon oxynitride film 3 according to the first example, the oxygen concentration is restrained at a low level. However, in the silicon oxycarbonitride film 4 that is formed by oxidating the silicon adsorption layer 7 to form the silicon oxynitride film 3 according to the second example, the oxygen concentration is increased.

As described above, the concentration of the oxygen in the silicon oxycarbonitride film 4 that is formed may be adjusted by controlling the order of performing the oxidating process of step 23 and the nitriding process of step 22 of the silicon adsorption layer 7.

According to the present embodiment, for example, if it is desired to restrain the oxygen concentration in the silicon oxycarbonitride film 4 to be 30 at. % or less, the method of forming the silicon oxynitride film 3 according to the first example may be preferable so that the silicon oxycarbonitride film 4 is formed by nitriding the silicon adsorption layer 7 first. When the silicon oxycarbonitride film 4 is formed by the method according to the first example, the silicon oxycarbonitride film 4 having an oxygen concentration ranging, for example, from 20 at. % to 30 at. %, may be easily obtained.

In addition, if it is desired that the concentration of the oxygen in the silicon oxycarbonitride film 4 exceeds 30 at. %, the method of forming the silicon oxynitride film 3 according to the second example may be preferable so that the silicon oxycarbonitride film 4 is formed by oxidating the silicon adsorption layer 7 first. When the silicon oxycarbonitride film 4 is formed by the method according to the second example, the silicon oxycarbonitride film 4 having an oxygen concentration that is, for example, greater than 30 at. % and equal to or less than 40 at. % may be easily obtained.

Also, in the second example, the oxidation amount of the silicon adsorption layer 7 may be a degree by which an oxygen adsorption layer of a level less than that of a single atomic layer is formed. As described above, since the nitrogen and the oxygen (N—O) do not bond to each other, when the surface of the silicon adsorption layer 7 is terminated with oxygen, it becomes difficult to bond the nitrogen used in the next nitriding process to the silicon. Thus, like the above described nitriding process, for example, the oxygen adsorption layer having a level less than a single atomic layer is formed on the silicon adsorption layer 7 so as to form a gap exposing the silicon adsorption layer 7 in the oxygen adsorption layer. Accordingly, the nitrogen used in the next nitriding process may be bonded to the silicon adsorption layer 7 exposed via the gap, and thus, the silicon oxynitride film 3 may be easily formed.

(Modified Example of the Method of Forming the Silicon Oxynitride Film 3 According to the First Example)

Figure 16:
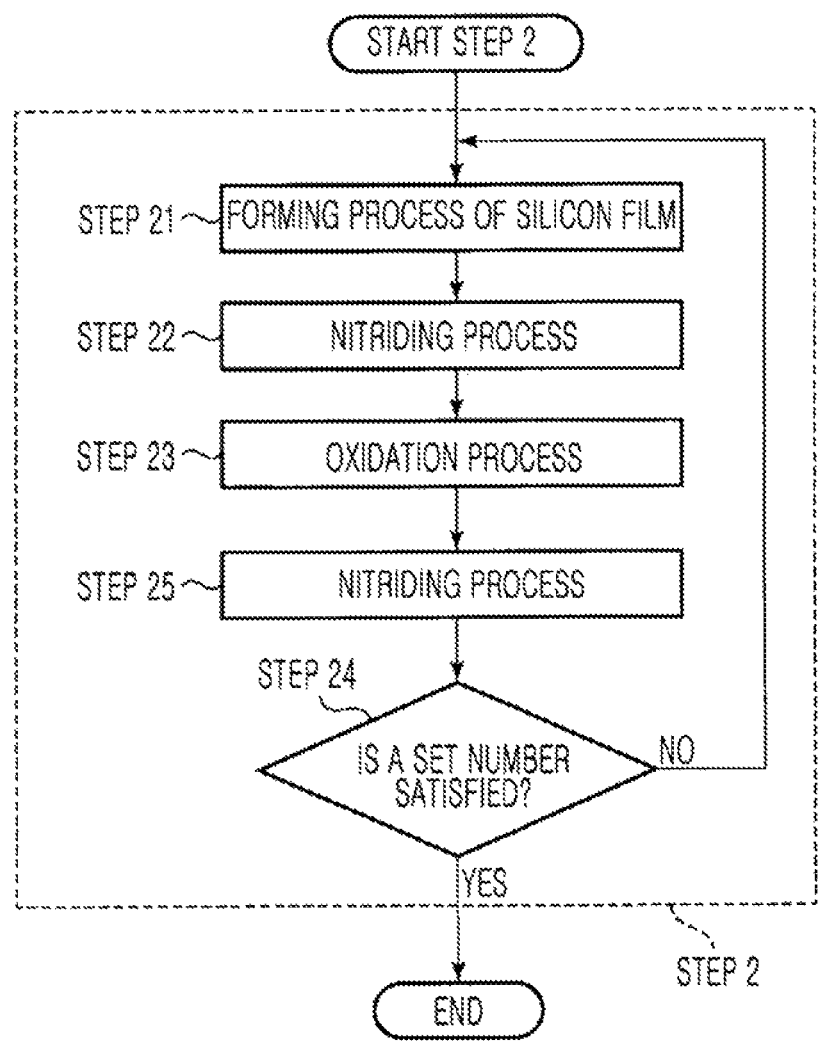
FIG. 16 is a flowchart describing a modified example of the method of forming a silicon oxynitride film according to the first example used in step 2 of the first embodiment of the present invention.

FIG. 16 is a flowchart describing a modified example of the method of forming the silicon oxynitride film according to the first example used in step 2 of the method according to the first embodiment.

As shown in FIG. 16, the modified example is different from the method of forming the silicon oxynitride film according to the first example described with reference to FIG. 10 in that a second nitriding process (step 25) is performed after the oxidation process (step 23).

According to the modified example, the silicon adsorption layer 7 (refer to FIG. 12A) is formed in step 21, the silicon adsorption layer 7 is nitrided to form the silicon nitride film 8 (refer to FIG. 12B) in step 22, and the silicon nitride film 8 is oxidated to form the silicon oxynitride film 3 (refer to FIG. 12C) in step 23. After that, the silicon oxynitride film 3 is additionally nitrided in step 25.

In the modified example, since the silicon oxynitride film 3 formed according to the first example is additionally nitrided, the oxygen concentration of the modified example may be less than that of, for example, the silicon oxycarbonitride film 4, in which the silicon oxynitride film 3 is formed according to the first example. Thus, the modified example may be appropriate in a case where the oxygen concentration in the silicon oxycarbonitride film 4 is desired to be restrained at lower level.

(Second Embodiment)

A second embodiment of the present invention relates to a film forming apparatus capable of performing the method of forming a silicon oxycarbonitride film, according to the first embodiment of the present invention.

Figure 17:
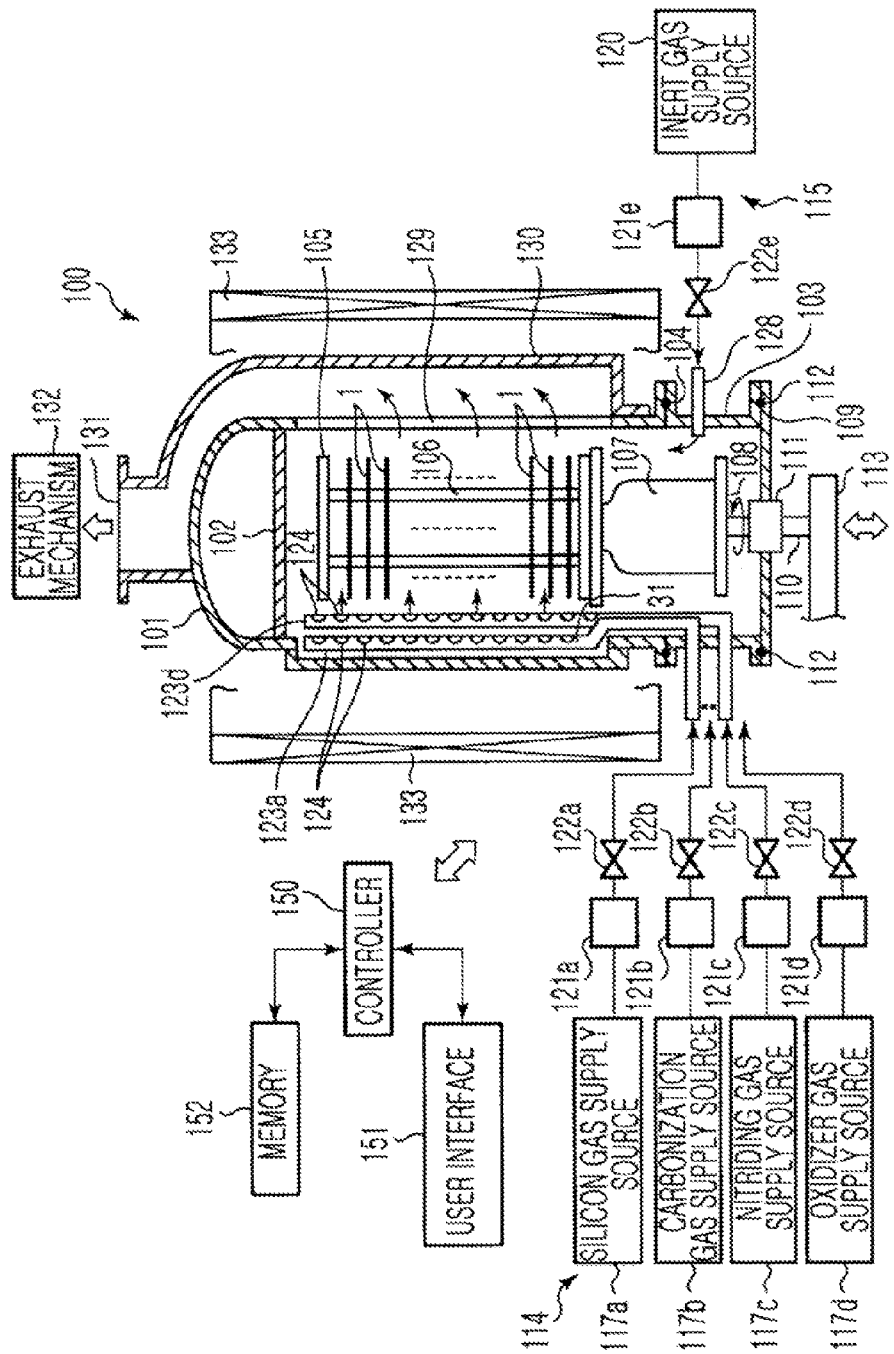
FIG. 17 is a cross-sectional view of a film forming apparatus capable of performing the method of forming a silicon oxycarbonitride film according to the first embodiment of the present invention.

FIG. 17 is a cross-sectional view schematically showing a film forming apparatus 100 capable of executing the method of forming a silicon oxycarbonitride film according to the first embodiment.

Referring to FIG. 17, the film forming apparatus 100 includes a processing chamber 101 formed as a cylinder having opened lower end and a ceiling. The processing chamber 101 may be entirely formed of, for example, quartz. A ceiling plate 102 formed of quartz is provided on the ceiling in the processing chamber 101. A manifold 103 formed of, for example, a stainless steel cylinder, is connected to the lower opening of the processing chamber 101 via a sealing member 104 such as an O-ring.

The manifold 103 supports a lower portion of the processing chamber 101. A wafer boat 105 that is formed of quartz and functions as a holding unit holding a plurality of processing targets, for example, 50 to 100 semiconductor substrates, in the present embodiment, silicon wafers 1, in multiple stages is configured to be inserted into the processing chamber 101 from a lower portion of the manifold 103. Accordingly, the silicon wafers 1 are accommodated in the processing chamber 101. The wafer boat 105 includes a plurality of pillars 106, and the plurality of silicon wafers are supported by recesses formed in the plurality of pillars 106.

The wafer boat 105 is placed on a table 108 via a thermos vessel 107 formed of quartz. The table 108 opens/closes the lower opening of the manifold 103. For example, the table 108 is supported on a rotary shaft 110 that penetrates through a cover portion 109 formed of, for example, stainless steel. A magnetic fluid seal 111, for example, is provided on a penetration portion of the rotary shaft 110 so as to rotatably support the rotary shaft 110 while sealing the rotary shaft 110 airtight. A sealing member 112 formed of, for example, an O-ring, is interposed between a peripheral portion of the cover portion 109 and the lower end portion of the manifold 103. Accordingly, a sealing property in the processing chamber 101 may be held. The rotary shaft 110 is attached to a leading end of an arm 113 supported by an elevation mechanism (not shown), for example, a boat elevator, so that the wafer boat 105, the cover portion 109, and the like are integrally elevated to be inserted into/withdrawn from the processing chamber 101.

The film forming apparatus 100 includes a processing gas supply mechanism 114 for supplying a gas used in a process in the processing chamber 101, and an inert gas supply mechanism 115 for supplying an inert gas in the processing chamber 101. The processing gas supply mechanism 114 of the present embodiment includes a silicon raw material supply source 117a, a carbonization gas supply source 117b, a nitriding gas supply source 117c, and an oxidizer gas supply source 117d. The inert gas supply mechanism 115 includes an inert gas supply source 120.

An example of the silicon raw material gas may be dichlorasilane, an example of the carbonization gas is ethylene, an example of the nitriding gas is ammonia, an example of the oxidizer gas is oxygen, and an example of the inert gas is nitrogen gas. The inert gas may be used as a purge gas.

The silicon raw material gas supply source 117a is connected to a distribution nozzle 123a via a flow controller 121a and an opening/closing valve 122a. Likewise, the carbonization gas supply source 117b, the nitriding gas supply source 117c, and the oxidizer gas supply source 117d are respectively connected to distribution nozzles 123b, 123c, and 123d via flow controllers 121b through 121d and opening/closing valves 122b through 122d.

Each of the distribution nozzles 123a through 123d formed as quartz tubes penetrates into the manifold 103 through a side wall of the manifold 103 and then bends upward to extend vertically. A plurality of gas discharge holes 124 are formed in a vertical portion of each distribution nozzle 123a. 123b, 123c, or 123d at predetermined intervals. Accordingly, each of the gases may be evenly discharged from the gas discharge holes 124 into the processing chamber 101 in a horizontal direction.

The inert gas supply source 120 is connected to a nozzle 128 via a flow controller 121e and an opening/closing valve 122e. The nozzle 128 is provided to penetrate through the side wall of the manifold 103 to eject the inert gas into the processing chamber 101 from a leading edge thereof in a horizontal direction.

An exhaust hole 129 for exhausting the processing chamber 101 is formed on a side opposite to the distribution nozzles 123a through 123d in the processing chamber 101. The exhaust hole 129 is formed thin and long by shaving off the side wall of the processing chamber 101 in an up-and-down direction. An exhaust hole cover member 130 having a U-shaped cross-section to cover the exhaust hole 129 is welded and attached to a portion corresponding to the exhaust hole 129 of the processing chamber 101. The exhaust hole cover member 130 extends upward along the side wall of the processing chamber 101, and defines a gas outlet 131 at an upper portion of the processing chamber 101. An exhaustion mechanism 132, including a vacuum pump or the like, is connected to the gas outlet 131. The exhaust mechanism 132 exhausts the processing chamber 101 to exhaust the processing gas used in the processes and to adjust a pressure in the processing chamber 101 to a processing pressure according to a process.

A heating unit 133 formed as a cylinder is provided on an outer circumference of the processing chamber 101. The heating unit 133 activates the gas supplied in the processing chamber 101, and at the same time, heats the processing target accommodated in the processing chamber 101, in the present embodiment, the silicon wafers 1.

Each element in the film forming apparatus 100 is controlled by a controller 150 including, for example, a microprocessor (computer). A user interface 151, including a touch panel, through which an operator performs an input manipulation of a command for managing the film forming apparatus 100, a display for visibly representing operating states of the film forming apparatus 100, and the like may be connected to the controller 150.

A memory 152 is connected to the controller 150. The memory 152 stores a control program for executing various processes performed in the film forming apparatus 100 according to control of the controller 150, or a program for each of the components in the film forming apparatus 100 to perform the process according to the processing conditions, for example, a recipe. The recipe is stored in, for example, a recording medium in the memory 152. The recording medium may be a hard disk, a semiconductor memory, or a portable memory such as a CD-ROM, a DVD, or a flash memory. Also, the recipe may be transmitted from another device through, for example, a dedicated line. If necessary, a recipe is loaded from the memory 152 according to a command from the user interface 151 or the like, and the controller 150 performs a process according to the loaded recipe. Thus, the film forming apparatus 100 may perform a desired process under the control of the controller 150.

In the present embodiment, processes according to the method of forming a silicon oxycarbonitride film, according to the first embodiment, are performed sequentially under the control of the controller 150.

The method of forming a silicon oxycarbonitride film, according to the first embodiment, may be executed by a film forming apparatus such as the film forming apparatus 100 shown in FIG. 17.

Also, the film forming apparatus is not limited to a batch-type film forming apparatus shown in FIG. 17, and a single-wafer type film forming apparatus may be used.

While this invention has been particularly shown and described with reference to exemplary embodiments thereof, it will be understood by one of ordinary skill in the art that various changes in form and details may be made therein without departing from the spirit and scope of the invention as defined by the appended claims.

For example, in the above embodiments, detailed examples of the processing conditions are described; however, the processing conditions are not limited to the above examples.

Also, in FIG. 1, the process of forming the silicon oxynitride film (step 2) is a final process; however, the process of forming the silicon carbonitride film may be performed after performing the operation of step 3 so that the process of forming the silicon carbonitride film may be the final process.

Also, in FIG. 7, the nitriding process (step 13) is the final process; however, a carbonization process may be performed after performing the operation of step 14 so that the carbonization process may be the final process. Likewise, the oxidation process (step 23) is the final process in FIG. 10 and the nitriding process (step 22) is the final process in FIG. 13; however, the nitriding process or the oxidation process may be performed after performing the operation of step 24 so that the nitriding process or the oxidation process is the final process.

Also, in the oxidation process, the oxidation may be any one of an ozone oxidation by using an ozone gas and a radical oxidation by using oxygen radicals, as well as an oxidation by using an oxygen gas. Likewise, in the nitriding process, the nitriding may be a radical nitriding using ammonia radicals, as well as a nitriding using an ammonia gas.

Besides, the present invention may be variously modified within a scope of the invention.

According to the present invention, the method of forming a silicon oxycarbonitride film, which is capable of improving workability and controlling the dry etching resistance and the wet etching resistance, may be provided.

What is claimed is:

1. A method of forming a silicon oxycarbonitride film on a base, the method comprising stacking a silicon carbonitride film and a silicon oxynitride film on the base to form the silicon oxycarbonitride film.

2. The method of claim 1, wherein forming of the silicon carbonitride film and forming of the silicon oxynitride film are repeatedly performed.

3. The method of claim 1, wherein forming of the silicon carbonitride film comprises a carbonization process and a nitriding process of a silicon film, and forming of the silicon oxynitride film comprises an oxidation process and a nitriding process of a silicon film.

4. The method of claim 3, wherein when the silicon carbonitride film is formed, the carbonization process and the nitriding process of the silicon film are repeatedly performed.

5. The method of claim 3, wherein when the silicon oxynitride film is formed, the oxidation process and the nitriding process of the silicon film are repeatedly performed.

6. The method of claim 3, wherein a concentration of oxygen in the silicon oxycarbonitride film that is formed is controlled by controlling an order of performing the oxidation process and the nitriding process of the silicon film.

7. The method of claim 6, wherein the concentration of the oxygen in the formed silicon oxycarbonitride film is controlled within a range from 20 at. % to 35 at. %.

8. The method of claim 1, wherein a refractive index of the formed silicon oxycarbonitride film when a wavelength of light is 633 nm ranges from 1.72 to 1.90.

9. The method of claim 6, wherein the concentration of the oxygen in the formed silicon oxycarbonitride film is controlled within a range from 20 at. % to 30 at. %.

10. The method of claim 1, wherein a refractive index of the formed silicon oxycarbonitride film when a wavelength of light is 633 nm ranges from 1.77 to 1.90.

* * * * *